United States Patent [19]

Fujiwara et al.

[11] Patent Number: 5,155,058
[45] Date of Patent: Oct. 13, 1992

[54] METHOD OF MAKING SEMICONDUCTOR MEMORY DEVICE

[75] Inventors: Shinji Fujiwara, Hiratsuka; Takao Yonehara, Atsugi, both of Japan

[73] Assignee: Canon Kabushiki Kaisha, Tokyo, Japan

[21] Appl. No.: 855,498

[22] Filed: Mar. 23, 1992

Related U.S. Application Data

[63] Continuation of Ser. No. 704,736, May 20, 1991, abandoned, which is a continuation of Ser. No. 426,529, Oct. 24, 1989, abandoned, which is a continuation of Ser. No. 115,977, Nov. 2, 1987, abandoned.

[30] Foreign Application Priority Data

Nov. 7, 1986 [JP] Japan .................. 61-264025

[51] Int. Cl.$^5$ .................................. H01L 21/70
[52] U.S. Cl. ............................. 437/52; 437/48; 437/56; 437/83; 437/915
[58] Field of Search .......... 437/47, 48, 52, 56, 437/60, 83, 89, 90, 99, 915, 973, 976; 357/23.1, 60, 41, 42; 365/182

[56] References Cited

U.S. PATENT DOCUMENTS

| 4,489,478 | 12/1984 | Sakurai | 437/9195 |
|---|---|---|---|
| 4,498,226 | 2/1985 | Imoue et al. | 437/915 |
| 4,500,905 | 2/1985 | Shibata | 357/55 |
| 4,517,583 | 5/1985 | Uchida | 357/51 |
| 4,596,604 | 6/1986 | Akiyama et al. | 357/91 |
| 4,685,199 | 8/1987 | Jastrzebski | 357/23.1 |
| 4,751,561 | 6/1988 | Jastrzebski | 357/55 |
| 4,768,076 | 8/1988 | Aoki et al. | 357/60 |
| 4,800,527 | 1/1989 | Ozaki et al. | 365/182 |
| 4,805,147 | 2/1989 | Yamamaka et al. | 365/182 |
| 4,999,313 | 3/1991 | Arikawa et al. | 437/89 |
| 5,028,976 | 7/1991 | Ozaki et al. | 437/83 |
| 5,070,034 | 12/1991 | Sato et al. | 437/90 |

FOREIGN PATENT DOCUMENTS

| 0056456 | 4/1983 | Japan | 437/915 |
|---|---|---|---|
| 61-180466 | 8/1986 | Japan | 357/23.1 |
| 61-180467 | 8/1986 | Japan | 357/23.1 |

Primary Examiner—Tom Thomas
Attorney, Agent, or Firm—Fitzpatrick, Cella, Harper & Scinto

[57] ABSTRACT

A semiconductor memory device has plural first transistors constituting an information memory circuit and plural second transistors constituting gate units for controlling information input and output. The plural first transistors and the plural second transistors are formed in mutually overlaying structure across an insulating layer. A heterogeneous material of a nucleation density sufficiently higher than that of the insulating layer and of a size small enough to grow a single nucleus of a semiconductor material is formed on the insulating layer. The transistors positioned on the insulating layer are formed in a monocrystalline or substantially monocrystalline semiconductor layer grown around the single nucleus formed on the different material.

3 Claims, 5 Drawing Sheets

METHOD OF MAKING SEMICONDUCTOR MEMORY DEVICE

This application is a continuation of application Ser. No. 07/704,736 filed May 20, 1991, now abandoned, which is a continuation of application Ser. No. 07/426,529 filed Oct. 24, 1989, now abandoned, which is a continuation of application Ser. No. 07/115,977 filed Nov. 2, 1987, now abandoned.

BACKGROUND OF THE INVENTION

1. Field of the Invention

The present invention relates to a semiconductor memory device, and more particularly to a semiconductor memory device having plural first transistors constituting an information memory circuit, and plural second transistors constituting a gate circuit for controlling information input and output.

2. Related Background Art

Recent development of so-called information society has stimulated the demand for memory devices, among which semiconductor memory devices occupy an important position due to their advantages performance and cost.

Among such semiconductor memory devices, there is already known a type having an information memory circuit for information storage and gate units for controlling the writing and reading of said information.

FIG. 1 is a circuit diagram showing an example of a static RAM of said type.

As shown in FIG. 1, the static RAM cell is composed of an information memory circuit 20 and gate units 21a, 21b.

The information memory circuit 20 consists of MOS transistors T1, T3 and MOS transistors T2, T4 constituting CMOS inverters.

The gate units 21a, 21b are composed of MOS transistors T5, T6 for connecting said information memory circuit 20 with read-out lines D, $\bar{D}$, and the MOS transistors T5, T6 function as gate elements through gates thereof connected to address lines AL.

In the manufacture of a semiconductor memory having an information memory circuit and gate units such as the static RAM mentioned above, it has not been possible to overlay the information memory circuit and the gate units consisting of MOS transistors, since it is generally difficult to form a monocrystalline semiconductor layer on an insulating layer. For this reason the information memory circuit and the gate units are placed side by side on a same conductive substrate, and the reading line and the address line are placed on an insulating layer. Consequently the density of integration can only be improved by overlaying the reading line and the address line in the wiring area, and a sufficient degree of integration has therefore been difficult to achieve.

SUMMARY OF THE INVENTION

The object of the present invention is to provide a semiconductor memory device with an improved density of integration achieved by overlaying the transistors of the information memory circuit and/or the gate units across an insulating layer. According to the present invention, the above-mentioned object can be achieved by providing, on an insulating layer, a heterogeneous material of a nucleation density sufficiently higher than that of said insulating layer and of a size sufficiently small to allow the growth of a single nucleus of a semiconductor material, and forming, on a monocrystalline or substantially monocrystalline semiconductor layer grown around said single nucleus of said different material, a transistor or transistors of the information memory circuit and the gate units, to be placed on said insulating layer. Consequently there is obtained a semiconductor memory device of a high degree of integration and of performance comparable to the case where the transistors are formed side by side on a same surface of a semiconductor substrate.

The steps for forming said monocrystalline or substantially monocrystalline semiconductor layer on said insulating layer are the same as those already known in the conventional semiconductor processes as will be explained later. These processes do not contain special steps.

DETAILED DESCRIPTION OF THE PREFERRED EMBODIMENTS

An embodiment of the present invention is described in detail, with reference to the attached drawings, as follows.

Figure 2:
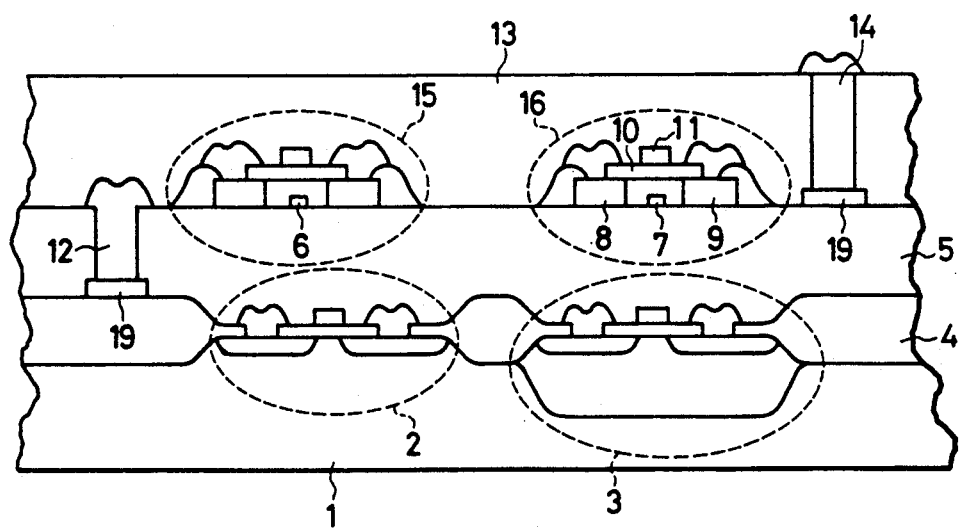
FIG. 2 is a schematic partial cross-sectional view of an embodiment of the semiconductor memory device of the present invention.
Figure 3:
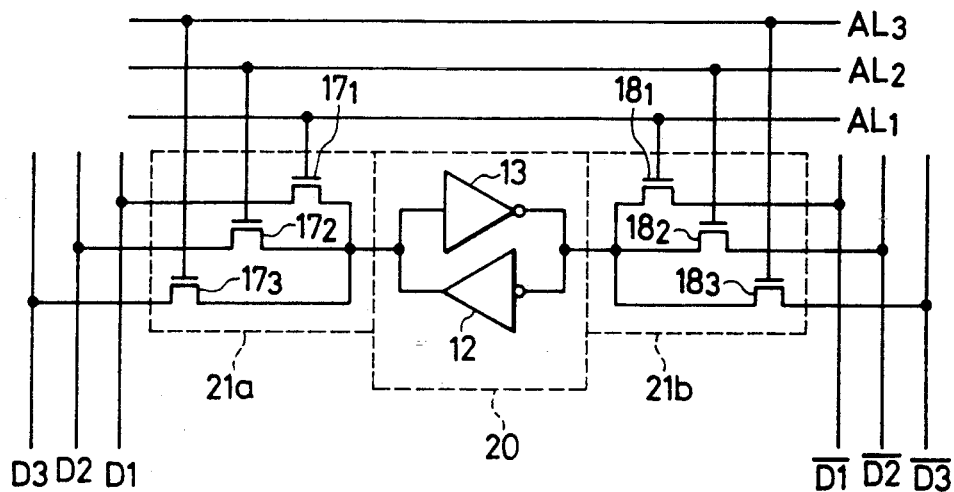
FIG. 3 is a circuit diagram of a memory cell of said semiconductor memory device.

FIG. 2 is a schematic partial cross-sectional view of the embodiment of the semiconductor memory device of the present invention, and FIG. 3 is a circuit diagram of a memory cell of said device.

Figure 1:
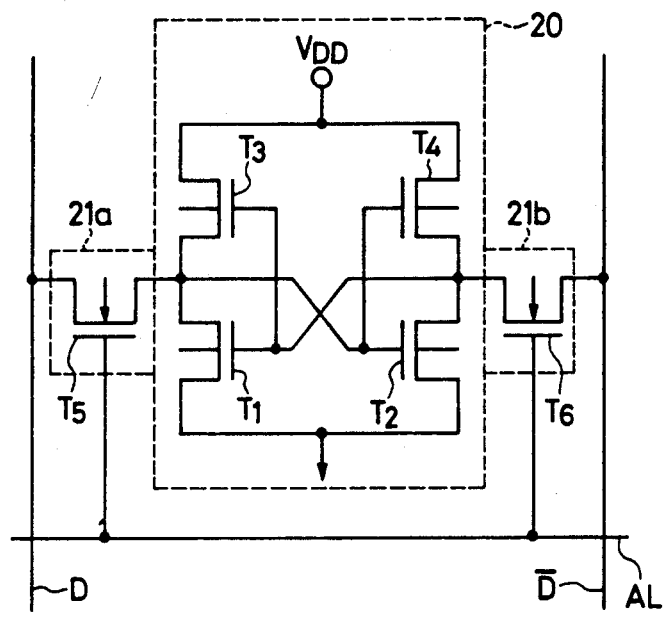
FIG. 1 is a circuit diagram of an example of a static RAM.

As shown in FIG. 3, the information memory circuit 20 of the present embodiment is composed of two CMOS inverters 12, 13 constituting a static RAM equivalent to that shown in FIG. 1. The input of the CMOS inverter 12 is connected to the output of the CMOS inverter 13, and to the sources of MOS transistors 181, 182, 183 of a gate unit 21b. Similarly the input of the CMOS inverter 13 is connected to the output of the CMOS inverter 12, and to the sources of MOS transistors 171, 172, 173 of a gate unit 21a. The gates of the MOS transistors 181, 182, 183 of the gate unit 21b are connected to address lines AL1, AL2, AL3, and the drains are connected to reading lines $\bar{D}1, \bar{D}2, \bar{D}3$. Similarly the gates of the MOS transistors 171, 172, 173 of the gate unit 21a are connected to address lines AL1, AL2, AL3, and the drains are connected to reading lines D1, D2, D3.

The address lines AL1, AL2, AL3 control the MOS transistors 171, 172, 173 of the gate unit 21a and the MOS transistors 181, 182, 183 of the gate unit 21b, thereby controlling the information writing and reading of the information memory circuit 20.

In the present embodiment plural MOS transistors 171-173, 181-183 are connected to the information memory circuit 20. By increasing the number of MOS transistors in the gate units 21a, 21b, the semiconductor memory device can be used in more different applications.

In the following there will be given the process of producing the semiconductor memory device explained above.

At first, as shown in FIG. 2, a p-channel MOS transistor 2 and an n-channel MOS transistor 3 are formed by a known semiconductor process on an n-silicon substrate, thus constituting CMOS transistors. The elements are mutually separated by a field insulating layer 4. An $SiO_2$ layer 5 constituting an insulating layer is formed on said CMOS transistors, on which $Si_3N_4$ films 6, 7, constituting a different material, are formed. Subsequently a monocrystalline or substantially monocrystalline silicon layer are grown around said $Si_3N_4$ layers 6, 7 by a process to be explained later. Said layer growth is conducted at a temperature of 700° to 1000° C. with a gas such as $SiH_4$, $SiCl_4$ or $SiHCl_3$, utilizing hydrogen as carrier gas. The ratio N of the silicon nucleation density B on the $Si_3N_4$ films 6, 7 to the nucleation density A on the $SiO_2$ layer 5 can be made equal to $B/A = 10^4$ or even larger under the above-mentioned conditions.

As the monocrystalline or substantially monocrystalline silicon layer has a polygonal shape after formation thereof, it is made flat by an integrated circuit technology such as an etch-back process. After said flattening, a conventional process for producing semiconductor devices is utilized to form a source area 8, a drain area 9 and a gate electrode 11 on a gate insulating layer 10, thereby forming MOS transistors 15, 16 constituting gate units. The connections with the underlying CMOS transistors are made by a wiring 19 through a contact hole 12. If additional MOS transistors are required for the gate units, an insulating layer 13 is formed on the MOS transistors 15, 16, and MOS transistors are formed thereon in similar manner and connected with the CMOS transistors positioned thereunder by a through hole 14 in the insulating layer 13.

In the above-explained embodiment, the MOS transistors constituting the gate units 21a, 21b are formed, across the insulating layer, on the CMOS transistors constituting the information memory circuit, but it is also possible to form the CMOS transistors constituting said memory circuit 20 on the MOS transistors constituting the gate units.

In the following there will be given a detailed explanation on the process for forming the monocrystalline or substantially monocrystalline semiconductor layer.

At first there will be given a selective deposition method, which selectively forms a thin film on a substrate, utilizing the difference, among various materials, of the factors influencing the nucleation in the film forming process, such as the surface energy, adhesion coefficient, elimination coefficient, surface diffusion speed etc.

Figure 4A:
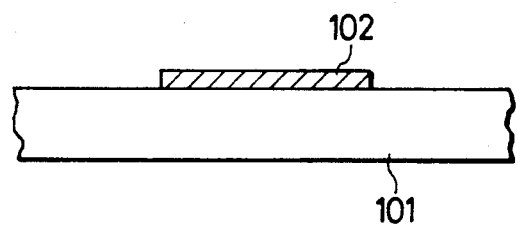
FIGS. 4A and 4B are schematic views showing the principle of selective deposition process.
Figure 4B:
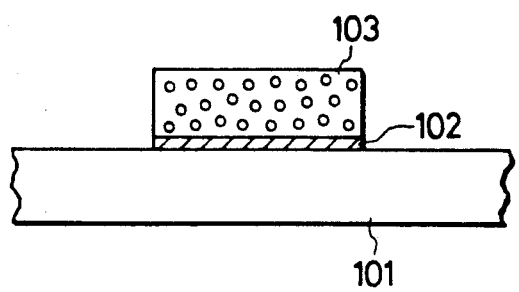

FIGS. 4A and 4B schematically illustrate the selective deposition method. At first, as shown in FIG. 4A, there is formed, on a substrate 101, a thin film 102 of a material different in said factors from the substrate 101 in a desired area. Then a thin film of a suitable material is deposited, and under suitable conditions it is possible to grow the thin film 103 only on the thin film 102 but not on the substrate 101. Such phenomenon enables the growth of a self-aligned thin film 103, thus dispensing with a conventional photolithographic process utilizing photoresist.

Examples of the materials employable in such selective deposition method are $SiO_2$ for the substrate 101, Si, GaAs or silicon nitride for the thin film 102, and Si, W, GaAs or InP for the thin film 103 to be deposited.

Figure 5:
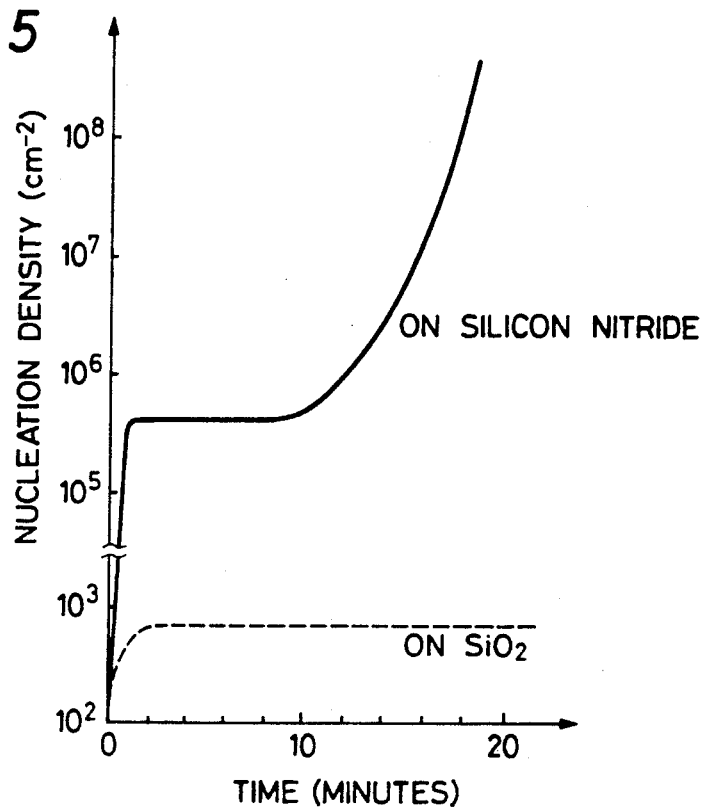
FIG. 5 is a chart showing time-dependent change of nucleus formation density on a deposited surface of $SiO_2$ and on a deposited surface of silicon nitride.

FIG. 5 is a chart showing the time-dependent change of the nucleation density on the deposited $SiO_2$ surface and on the deposited silicon nitride surface.

As shown in said chart, the nucleation density on $SiO_2$ becomes saturated at a level under $10^3$ cm$^{-2}$ soon after the start of deposition, and the density scarcely changes even after 20 minutes from the start.

On the other hand, on silicon nitride ($Si_3N_4$), the nucleation density is once saturated at a level about $4 \times 10^5$ cm$^{-2}$ and retains said level for about 10 minutes, but rapidly increases thereafter. In this example the deposition was conducted by CVD method at a pressure of 175 Torr and a temperature of 1000° C., utilizing $SiCl_4$ gas diluted with $H_2$ gas. Also similar results can be achieved with another reaction gas such as $SiH_4$, $SiH_2Cl_2$, $SiHCl_3$ or $SiF_4$ under suitably regulated pressure and temperature. Also vacuum evaporation can be used for this purpose.

In this case the nucleation on $SiO_2$ is negligibly small, but the addition of HCl gas to the reaction gas further suppresses the nucleation on $SiO_2$, and completely eliminates the Si deposition on $SiO_2$ Such phenomenon is principally ascribable to the difference, between $SiO_2$ and silicon nitride, in the absorption coefficinet, peeling coefficient, surface diffusion speed etc. to silicon, but the selective deposition is also caused by a fact that silicon atoms react with $SiO_2$ to generate silicon monoxide of a high vapor pressure, thereby etching $SiO_2$ itself, whereas such etching phenomenon does not occur on silicon nitride (T. Yonehara, S. Yoshioka, S. Miyazawa, Journal of Applied Physics 53, 6839, 1982).

As shown in FIG. 5, a sufficiently large difference in nucleation density can be obtained by employing $SiO_2$ and silicon nitride for the surface to be subjected to deposition, with silicon as the depositing material. Though $SiO_2$ is preferred for the surface receiving the deposition, a difference in the nucleation density can also be obtained with $SiO_x$.

Naturally the present invention is not limited to these materials, but a difference in the nucleation density in excess of $10^3$ is enough as shown in FIG. 5 and allows sufficient selective deposition even with the materials to be explained later.

Said difference in the nucleation density may also be obtained by local ion implantation of Si or N on $SiO_2$ for forming areas having an excess in Si or N.

Such selective deposition method can be utilized for forming a different material of a nucleation density sufficiently larger than that of the material of the depositing surface, in such a small size as to allow growth of a single nucleus, and selectively growing thereon a single crystal or a substantially single crystal only in the position of said small different material.

Since the selective growth of said single crystal or substantially single crystal is determined by the state of electrons on the depositing surface, particularly the state of dangling bonds, the material of lower nucleation density, for example $SiO_2$, need not be a bulk material but can be formed on an arbitrary material or substrate.

FIGS. 6A to 6D illustrate steps of an example of the method for forming said single crystal or substantially single crystal. FIGS. 7A and 7B are perspective views of a substrate respectively in the steps shown in FIGS. 6A and 6D.

Figure 6A:
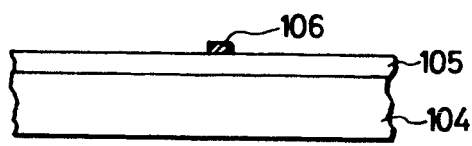
FIGS. 6A to 6D are views showing steps for forming a monocrystalline or substantially monocrystalline layer.
Figure 7A:
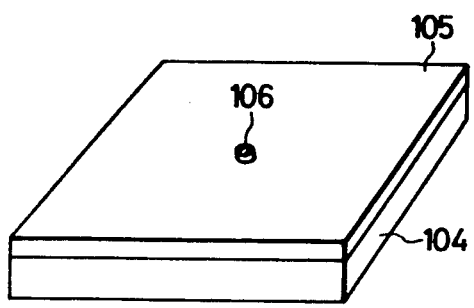
FIGS. 7A and 7B are perspective views of the substrate respectively at the steps shown in FIGS. 6A and 6D.
Figure 7B:
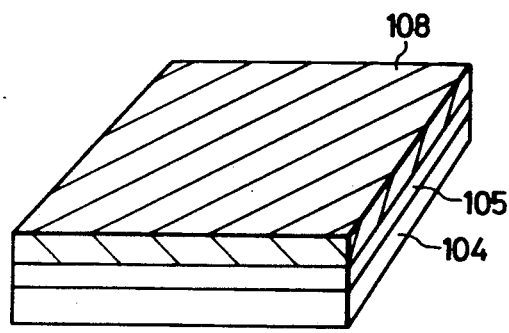

At first, as shown in FIGS. 6A and 7A, a thin film 105 of a, low nucleation density enabling selective deposition is formed on a substrate 104. Then a different material of a higher nucleation density is thinly deposited on said thin film 105 and patterned for example by a lithographic process in a sufficinetly small size, as indicated by 106. The substrate 104 can be of arbitrary size, crystal structure and composition, and may have functional device thereon. Also said different material 106 can be a modified area having an excess in Si or N, formed by ion implantation thereof into the thin film 105 as explained above.

Figure 6B:
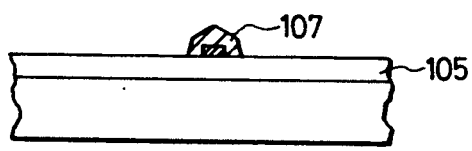

Then, under suitable depositing conditions, a single nucleus of a thin film material is formed only on the different material 106. Stated differently, the different material 106 has to be formed so small as to allow growth of a single nucleus only. For this purpose, the size of the different material 106 should be several microns or smaller, though it depends on the material to be used. The nucleus grows, maintaining the monocrystalline or substantially monocrystalline structure, to form an island-shaped monocrystalline particle 107 as shown in FIG. 6B, and, as already explained before, complete absence of nucleation on the thin film 105 is indispensable for obtaining such particle 107.

Figure 6C:
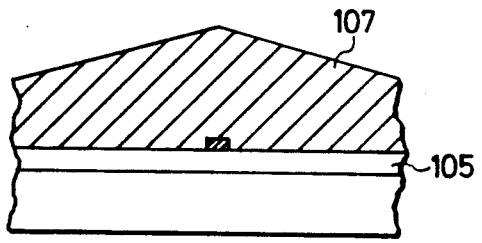

The island-shaped monocrystalline particle 107 further grows, maintaining the monocrystalline or substantially monocrystalline structure, to eventually cover the entire thin film 105 as shown in FIG. 6C.

Figure 6D:
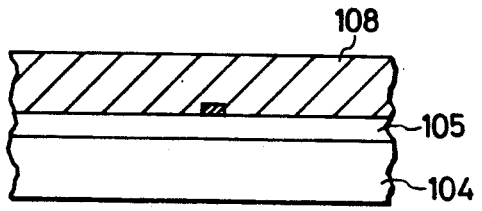

Subsequently the monocrystalline particle 107 is flattened by etching or lapping to obtain, as shown in FIGS. 6D and 7B, a monocrystalline layer 108 enabling formation of desired devices, on the thin film 105.

Due to the presence of the thin film 105 constituting the depositing surface, the underlying substrate 104 can be composed of an arbitrary material. Thus a monocrystalline or substantially monocrystalline layer can be easily formed even if the substrate has functional devices thereon.

In the foregoing embodiment the depositing surface is composed of a thin film 105, but it is also possible to employ a substrate composed of a material of a low nucleation density enabling selective deposition and to form a monocrystalline or substantially monocrystalline layer thereon.

EXAMPLE

In the following there will be given more detailed examples of the method of forming the monocrystalline layer in the foregoing embodiment.

$SiO_2$ is employed as the thin film 105 constituting the depositing surface. Naturally there may be employed a quartz substrate, or a $SiO_2$ layer may be formed by sputtering, CVD or vacuum evaporation on an arbitrary substrate composed for example of metal, semiconductor, magnetic material, piezoelectric material or insulating material. Though the depositing surface is preferably composed of $SiO_2$, it may also be composed of $SiO_x$ with a different value of x.

On the $SiO_2$ layer 105 thus formed, a silicon nitride ($Si_3N_4$) layer or a polycrystalline silicon layer is deposited by gaseous growth as the different material, and is patterned with an ordinary lithographic process or a lithographic process utilizing X-ray, an electron beam or an ion beam to form the small different material 106 not exceeding several microns, preferably about 1 micron, in size.

Then Si is selectively grown on the substrate with a gaseous mixture of HCl, $H_2$ and $SiH_2Cl_2$, $SiCl_4$, $SiHCl_3$, $SiF_4$ or $SiH_4$, with a substrate temperature of 700°–1000° C. and a pressure of ca. 100 Torr.

Within a period of several tens of minutes, a monocrystalline silicon particle 107 grows around the small different material 106 composed of silicon nitride or polycrystalline silicon on $SiO_2$, even to a size of several tens of microns under optimum conditions.

Subsequently reactive ion etching (RIE) having an etch rate difference between Si and $SiO_2$ is conducted to flatten silicon, thereby obtaining a polycrystalline silicon layer of controlled particle size. Then the particle boundary portions are removed to obtain an island-shaped monocrystalline silicon layer 108. If the monocrystalline particle 107 has an irregular surface, the etching is conducted after mechanical lapping.

Thus formed monocrystalline silicon layer 108, of several tens of microns in size and free from particle boundaries, enables formation of field effect transistors comparable in performance to those formed on a monocrystalline silicon wafer.

Also it is electrically separated by $SiO_2$ from the neighboring monocrystalline silicon layer 108, so that CMOS transistors formed therein are free from mutual interference. Besides, as the active layer of the device is thinner than that formed in a silicon wafer, it is possible to prevent erroneous operation caused by a charge induced by an irradiation. Furthermore a lower parasite capacitance results in a higher operating speed of the device. Also the possibility of using an arbitrary substrate allows the monocrystalline layer to form on a larger substrate with a lower cost than in case of silicon wafer. Furthermore it is rendered possible to obtain a multifunctional three-dimensional integrated circuit as the monocrystalline layer can be formed on a substrate composed of a semiconductive material, a piezoelectric material or a dielectric material.

Composition of Silicon Nitride

A sufficiently large difference in the nucleation density between the material constituting the depositing surface and the different material, as explained before, can be obtained not only with $Si_3N_4$ but also with silicon nitride of different composition.

In the formation of the silicon nitride film with plasma CVD by decomposing $SiH_4$ gas and $NH_3$ gas in RF plasma at a low temperature, the ratio of Si to N in the deposited silicon nitride film can be significantly varied by a change in the flow rate ratio of $SiH_4$ gas and $NH_3$ gas.

Figure 8:
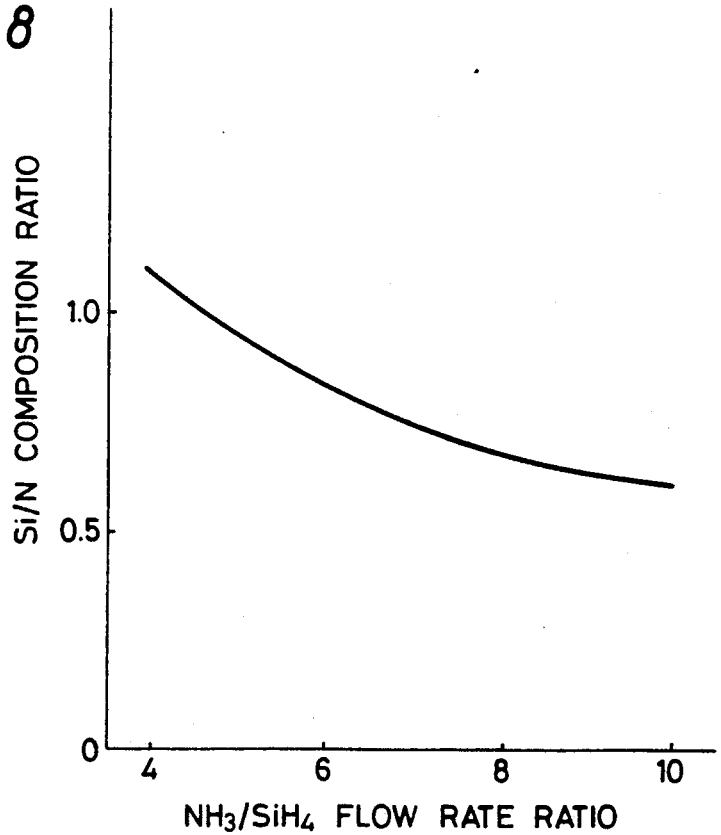
FIG. 8 is a chart showing the relationship between the flow rate ratio of $SiH_4$ and $NH_3$, and the ratio of Si and N in the resulting silicon nitride film.

FIG. 8 shows Si/N composition ratio in the deposited silicon nitride film as a function of the flow rate ratio of $SiH_4$ and $NH_3$.

In this example the deposition was conducted with an RF output of 175 W and a substrate temperature of 380°

C., and with a fixed flow rate of $SiH_4$ gas at 300 cc/min and a varying flow rate of $NH_3$ gas. In response to a change in the $NH_3/SiH_4$ flow rate ratio from 4 to 10, the Si/N ratio in the silicon nitride film, determined by electron spectroscopy shows a change from 1.1 to 0.58.

On the other hand, a silicon nitride film formed with a reduced pressure CVD method by introducing $SiH_2Cl_2$ gas and $NH_3$ gas at a pressure of 0.3 Torr and a temperature of ca. 800° C. showed a composition close to the stoichiometric ratio of $Si_3N_4$ (Si/N=0.75).

Also a silicon nitride film formed by thermal treatment of Si with ammonia or $N_2$ at ca. 1200° C. (thermal nitrization) showed a composition even closer to the stoichiometric ratio, as the film formation was achieved under thermal equilibrium.

Such silicon nitrides obtained in various methods, when used in silicon nuclei growth as the material having a higher nucleation density, provide a nucleation density variable according to the composition ratio.

Figure 9:
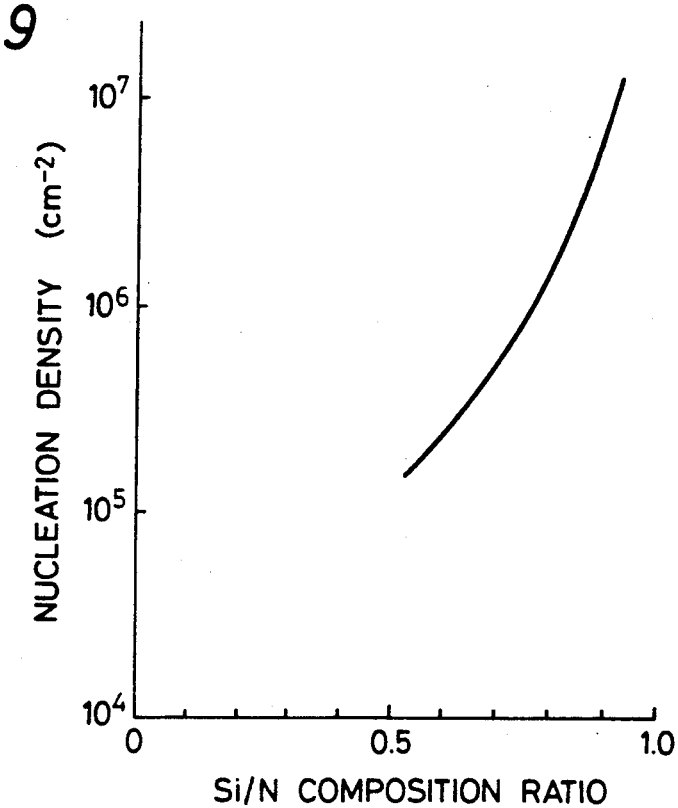
FIG. 9 is a chart showing the relationship between the ratio of Si/N and the nucleation density.

FIG. 9 shows the nucleation density as a function of the Si/N composition ratio. As shown in FIG. 9, a change in the composition of silicon nitride film significantly varies the density of silicon nuclei developed thereon. The Si nucleation was conducted by reacting $SiCl_4$ of 175 Torr with $H_2$ at 1000° C.

This phenomenon of the change in the nucleation density as a function of the composition of silicon nitride influences the size of silicon nitride formed sufficiently small for growing a single nucleus. Stated differently, silicon nitride of a composition of a large nucleation density cannot grow a single nucleus unless the particle is formed very small.

It is therefore necessary to select the nucleation density and the optimum size of silicon nitride allowing single nucleus formation. For example, under depositing conditions providing a nucleation density of ca. $10^5$ cm$^{-2}$, single nucleus formation can be achieved if the size of silicon nitride is ca. 4 μm or smaller.

Formation of Heterogeneous Material by Ion Implantation

A difference in nucleation density from Si can also be realized by local ion implantation of Si, N, P, B, F, Ar, He, C, As, Ga, Ge etc. on the surface of $SiO_2$ constituting a depositing surface of low nucleation density to form modified areas thereon, and utilizing said modified areas as the depositing surface of high nucleation density.

As an example, the surface of $SiO_2$ is covered with photoresist, and is partially exposed to the outside in desired areas by exposing and developing the photoresist in said areas.

Then Si ions are implanted, from $SiF_4$ source gas, into the $SiO_2$ surface with a voltage of 10 keV and with a density of $1 \times 10^{16}$ to $1 \times 10^{18}$ cm$^{-2}$. The projection stroke is 114 Å, and the Si concentration at the $SiO_2$ surface reaches as high as ca. $10^{23}$ cm$^{-2}$. The ion implanted area is amorphous as $SiO_2$ is originally amorphous.

The modified area can be obtained by ion implantation utilizing photoresist as explained above, or by ion implantation of Si ions into the $SiO_2$ surface with a concentrated ion beam and without photoresist.

After such ion implantation, the photoresist is removed to obtain a modified area with an excess in Si, on the $SiO_2$ surface. Then silicon is grown in gaseous phase on the $SiO_2$ depositing surface, having such modified areas.

Figure 10:
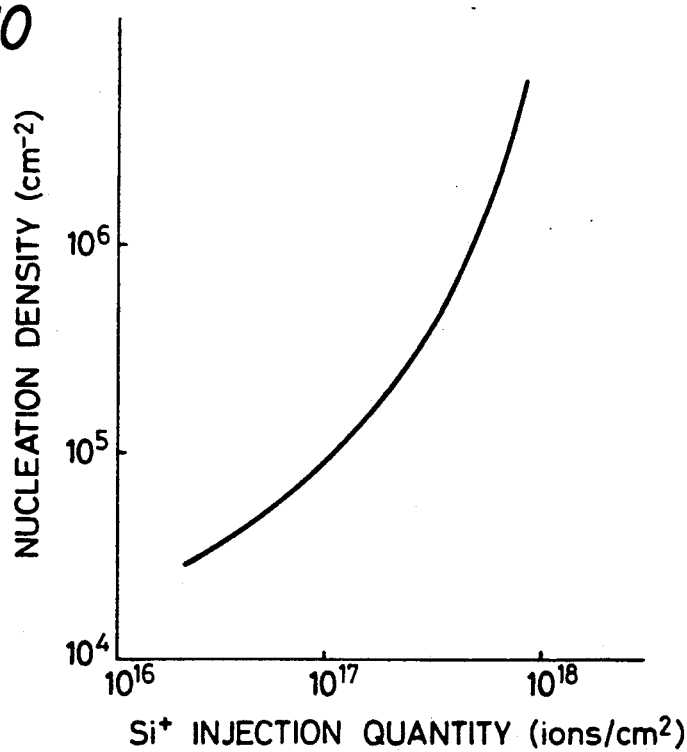
FIG. 10 is a chart showing the relationship between the amount of Si ion implantation and the nucleation density.

FIG. 10 shows the nucleation density as a function of the amount of implanted Si ions. As shown in FIG. 10, the nucleation density increases with the increase in the amount of implanted Si ions.

It is therefore possible to grow a single silicon nucleus on said modified area, functioning as the different material, by forming said modified area sufficiently small, and therefore to grow a single crystal as explained above.

A sufficiently small modified area allowing a single nucleus growth can be easily obtained by a patterning with photoresist or by concentrating the ion beam.

Silicon Deposition Other Than CVD

Monocrystalline growth by selective silicon nucleus formation can be achieved not only by CVD but also by evaporating silicon with an electron gun in vacuum ($<10^{-6}$ Torr) and depositing on a heated substrate. Particularly in molecular beam epitaxy (MBE) utilizing evaporating in ultra high vacuum ($<10^{-9}$ Torr) it is known that the Si beam and $SiO_2$ start to react at a substrate temperature of 900° C. or higher to completely eliminate Si nucleation on $SiO_2$ (T. Yonehara, S. Yoshioka and S. Miyazawa, Journal of Applied Physics 53, 10, p. 6839, 1982).

This phenomenon could be utilized in forming a single silicon nucleus with complete selectivity in each of scattered small silicon nitride areas on $SiO_2$ and growing monocrystalline silicon thereon. The deposition was conducted under vacuum of $10^{-8}$ Torr or lower, a Si beam intensity of $9.7 \times 10^{14}$ atoms/cm$^2$. sec and a substrate temperature of 900° to 1000° C.

In this case a reaction $SiO_2 + Si \rightarrow 2SiO \uparrow$ generates a reaction product SiO with a very high vapor pressure, with the resulting etching of $SiO_2$ itself by Si.

On the other hand silicon nitride does not cause such etching but nucleation and deposition thereon.

Consequently similar results can be obtained tantalum oxide ($Ta_2O_5$) or silicon oxynitride (SiON) instead of silicon nitride, as the material with high nucleation density. More specifically, similar monocrystalline growth can be achieved by forming these materials in a small form as the different material explained above.

The above-explained single crystal growing method enables formation of a semiconductor crystal layer on an insulating layer.

The above-explained single crystal growing of transistors constituting an information memory circuit with those constituting gate units, thereby enabling a higher degree of integration and providing a semiconductor memory device of a high capacity.

Also in the present embodiment, a laminate structure of the transistors constituting gate units allows formation of a larger number of input-output control transistors within a same area, thereby providing a semiconductor memory device usable for multiple purposes.

What is claimed is:

1. A method for producing a semiconductor memory device comprising a first plurality of transistors constituting an information memory circuit and a second plurality of transistors constituting gate units for controlling information input to and output from the information memory circuit, the first plurality of transistors and the second plurality of transistors being formed in mutually overlying structure across an insulating layer, the method comprising forming either the first plurality of transistors or the second plurality of transistors by a process comprising the steps of:

forming a first material, having a nucleation density sufficiently higher than that of the insulating layer, on the insulating layer in a sufficiently small area so as to form only a single nucleus from which a single crystal of a semiconductor material is grown; and
growing a layer of monocrystalline semiconductor material, different from the first material, by a vapor phase process around a single nucleus grown from the first material.

2. A method for producing a semiconductor memory device according to claim 1, wherein only the second plurality of transistors are formed by said process.

3. A method for forming a semiconductor memory device comprising a first plurality of transistors constituting an information memory circuit and a second plurality of transistors constituting gate units for controlling information input to and output from said information memory circuit, said method comprising the steps of:

forming an insulating layer on a substrate having said first plurality of transistors;

forming a first material having a nucleation density sufficiently higher than that of said insulating layer in a small enough area so as to form only a single nucleus from which a single crystal of a semiconductor material is grown; and growing a layer of monocrystalline semiconductor material, different from said first material, by applying vapor deposition around a single nucleus grown from said first material.

* * * * *

UNITED STATES PATENT AND TRADEMARK OFFICE
CERTIFICATE OF CORRECTION

PATENT NO. : 5,155,058

DATED : October 13, 1992

INVENTOR(S) : Shinji Fujiwara, et al

Page 1 of 2

It is certified that error appears in the above-indentified patent and that said Letters Patent is hereby corrected as shown below:

On the title page, Item

[56] U.S. PATENT DOCUMENTS

"Imoue et al." should read --Inoue et al.--.

COLUMN 1

Line 24, "advantages" should read --advantages in--.

COLUMN 3

Line 28, "are" should read --is--.

COLUMN 4

Line 39, "$SiO_2$" should read --$SiO_2$.--.
Line 41, "coefficinet" should read --coefficient--.

UNITED STATES PATENT AND TRADEMARK OFFICE
CERTIFICATE OF CORRECTION

PATENT NO. : 5,155,058
DATED : October 13, 1992
INVENTOR(S) : Shinji Fujiwara, et al It is certified that error appears in the above-indentified patent and that said Letters Patent is hereby corrected as shown below:

COLUMN 5

Line 15, "a," should read --a--.
Line 60, "EXAMPLE" should read --EXAMPLES--.

Signed and Sealed this

Twelfth Day of October, 1993

BRUCE LEHMAN

Attest:

Attesting Officer

Commissioner of Patents and Trademarks